United States Patent
Seo

(10) Patent No.: US 6,937,675 B2
(45) Date of Patent: Aug. 30, 2005

(54) APPARATUS FOR IMPROVING INTERMODULATION DISTORTION CHARACTERISTICS IN A CDMA MOBILE TERMINAL

(75) Inventor: Ho-Soo Seo, Suwon-shi (KR)

(73) Assignee: Samsung Electronics Co., LTD (KR)

( * ) Notice: Subject to any disclaimer, the term of this patent is extended or adjusted under 35 U.S.C. 154(b) by 859 days.

(21) Appl. No.: 09/816,734

(22) Filed: Mar. 22, 2001

(65) Prior Publication Data

US 2003/0206576 A1 Nov. 6, 2003

(30) Foreign Application Priority Data

Mar. 22, 2000 (KR) ......................................... 2000-14520

(51) Int. Cl.[7] .............................. H03D 1/04; H03D 1/06; H03K 5/01; H03K 6/04; H04B 1/10
(52) U.S. Cl. ...................... 375/346; 375/345; 375/350; 375/316; 330/149; 455/296
(58) Field of Search ................................ 375/148, 346, 375/350, 345, 316; 330/149; 455/232.1, 233.1, 234.1, 234.2, 249.1, 296, 63.1

(56) References Cited

U.S. PATENT DOCUMENTS

| | | | | |
|---|---|---|---|---|
| 4,329,655 A | * | 5/1982 | Nojima et al. | 330/149 |
| 5,396,189 A | * | 3/1995 | Hays | 330/149 |
| 5,603,114 A | * | 2/1997 | Tomita | 455/249.1 |
| 5,999,559 A | * | 12/1999 | Takaki | 375/130 |
| 6,205,189 B1 | * | 3/2001 | Ha | 375/345 |
| 6,208,849 B1 | * | 3/2001 | Cho et al. | 455/296 |

* cited by examiner

*Primary Examiner*—Phuong Phu
(74) *Attorney, Agent, or Firm*—Dilworth & Barrese LLP

(57) ABSTRACT

Disclosed is an apparatus for improving an intermodulation distortion characteristic by controlling a gain of an attenuator in a CDMA mobile terminal. The apparatus includes a converter for passing input signal components except an IF signal component, amplifying the passed input signal to a specific level, converting the amplified signal to a DC signal, comparing the DC signal with first and second thresholds, and generating a control signal for controlling an operating point of the attenuator by synthesizing the compared result signals.

6 Claims, 3 Drawing Sheets

APPARATUS FOR IMPROVING INTERMODULATION DISTORTION CHARACTERISTICS IN A CDMA MOBILE TERMINAL

PRIORITY

This application claims priority to an application entitled "Apparatus for Improving Intermodulation Distortion Characteristics in a CDMA Mobile Terminal" filed in the Korean Industrial Property Office on Mar. 22, 2000 and assigned Serial No. 2000-14520, the contents of which are hereby incorporated by reference.

BACKGROUND OF THE INVENTION

1. Field of the Invention

The present invention relates generally to a received signal processing technique in a CDMA mobile terminal, and in particular, to an apparatus for reducing intermodulation distortion generated while processing a received signal.

2. Description of the Related Art

An existing digital CDMA (Code Division Multiple Access) mobile terminal has a transmission frequency band of 824–849 MHz and a reception frequency band of 869–894 MHz. An analog AMPS (Advanced Mobile Phone System) mobile terminal also has the same transmission and reception frequency bands. Since the CDMA mobile terminal and the AMPS mobile terminal have the same frequency bands, the CDMA mobile terminal is so designed to reduce and/or eliminate interference with the AMPS signals. That is, the CDMA mobile terminal is so designed as to have the constant reception performance, even though there exist AMPS signals around the CDMA channel.

In this connection, there has been proposed an IS-95 intermodulation distortion characteristic specification. The CDMA mobile terminal should be so manufactured as to satisfy this specification. For reference, the IS-95 intermodulation distortion characteristic specification is shown in Table 1 below.

TABLE 1

|   | Traffic Signal | 1st Jammer Signal (±900 KHz Offset) | 2nd Jammer Signal (±1700 KHz Offset) |
| --- | --- | --- | --- |
| 1 | −101 dBm | −43 dBm | −43 dBm |
| 2 | −90 dBm | −32 dBm | −32 dBm |
| 3 | −79 dBm | −21 dBm | −21 dBm |

In the prior art, there have been proposed several methods for satisfying the above conditions. However, the proposed methods are all performed by software. That is, in the existing methods, the mobile terminal operates according to software processing to satisfy the above-stated specification.

FIG. 1 shows a typical structure of the conventional CDMA mobile terminal. Specifically, FIG. 1 shows a structure of a signal processor for processing transmission and reception signals.

Referring to FIG. 1, a receiver of the CDMA mobile terminal includes a duplexer 100, a low-noise amplifier (LNA) 112, an RF (Radio Frequency) filter 114, a mixer 116, and an IF (Intermediate Frequency) filter 118. Further, the receiver includes an attenuator 110 provided in front of the low-noise amplifier 112 to satisfy the intermodulation distortion (IMD) characteristics. The attenuator 110 is provided to solve a reception performance degradation problem due to the intermodulation noise components which are generated when the two CDMA and AMPS continuous waves having the same frequency band are input to the low-noise amplifier 112. The attenuator 110 solves the reception performance degradation problem by properly controlling a gain of the signals applied to the low-noise amplifier 112. The IF filter 123 inputs the modulated IF signals and filters the predetermined transmitting IF frequency signals. The mixer 121 mixes the output of the IF filter 123 with the predetermined local oscillating signals and thus outputs the RF signals. The RF filter 119 filters the mixed signals and detects the RF signals. The drive amplifier 117 amplifies the level of the RF signals so as to obtain the power for driving the power amplifier 113 as stated below. The duplexer 100 switches the connection of the antennas and the transmitting and receiving portion. The RF filter 115 filters the output of the driving amplifier 117, once again. The power amplifier 113 amplifies the filtered RF signals to the predetermined level. The isolator 111 is connected between the output end of the power amplifier 113 and the input end of the duplexer 100 so as to avoid the transmitting distortion of the reflection wave, thereby transmitting the output of the power amplifier 113 to the duplexer 100 without any attenuating. The duplexer 100 switches antenna 130 between a transmitting and receiving mode.

Now, an operation of the CDMA mobile terminal will be described in detail. In accordance with the unique characteristics of the CDMA system, a level of an IF signal output from the mixer 116 has a constant value regardless of the strength of a signal received at an antenna ANT. The mixer 116 performs this operation under the control of a controller (now shown).

For information, a voltage level for controlling the mixer 116 is adjusted depending on the strength of the signals received at the receiver. Such a power control method is generally called "open-loop power control". There is a case where the received signal strength becomes higher than a predetermined level. In this case, the controller attenuates the received signal depending on the received signal strength by outputting an intermodulation distortion (IMD) characteristic control signal. To this end, the controller generates a control signal for properly controlling a gain of the attenuator 110. This control signal is generally referred to as an "IMD characteristic control signal" or "IMD control voltage". By doing so, it is possible to decrease the intermodulation distortion, thereby solving the reception performance degradation problem.

In this case, however, the conventional CDMA mobile terminal of FIG. 1 has the following disadvantages. That is, the attenuator 110 is controlled through a software process which is performed by the controller. Hence, this method inevitably includes an additional software process, making it difficult to control the attenuator 110 in real time. Further, the additional software process may raise an overload problem of the controller. In particular, since the attenuator 110 is controlled by software, it is very difficult to match the correct control timing.

In other words, the controller calculates the control signal for the attenuator 110 by performing the software process on the received jammer signals, so that the control signal will be generated after certain time delay. In addition, since the hardware interacts with the software, it is necessary to control an accurate operating point.

SUMMARY OF THE INVENTION

It is, therefore, an object of the present invention to provide a hardware apparatus for controlling an attenuation of a received signal in order to solve a reception performance degradation problem due to intermodulation distortion in a CDMA mobile terminal.

To achieve the above and other objects, there is provided an apparatus for improving an intermodulation distortion characteristic by controlling a gain of an attenuator in a CDMA mobile terminal. The apparatus includes a converter for passing input signal components except an IF signal component, amplifying the passed input signal to a specific level, converting the amplified signal to a DC signal, comparing the DC signal with first and second thresholds, and generating a control signal for controlling an operating point of the attenuator by synthesizing the compared result signals.

Preferably, the converter comprises a filter for passing the input signal components except the IF signal component; an IF amplifier for amplifying a signal output from the filter to the specific level; an integrator for converting a signal output from the IF amplifier to a DC signal; first and second comparators for comparing a signal output from the integrator with the first and second thresholds, respectively; and a synthesizer for synthesizing signals output from the first and second comparators.

Preferably, the filter is comprised of a notch filter for passing the input signal components except the IF signal component. Alternatively, the filter is comprised of a high-pass filter for filtering a high-frequency band signal and a low-pass filter for passing a low-frequency band signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
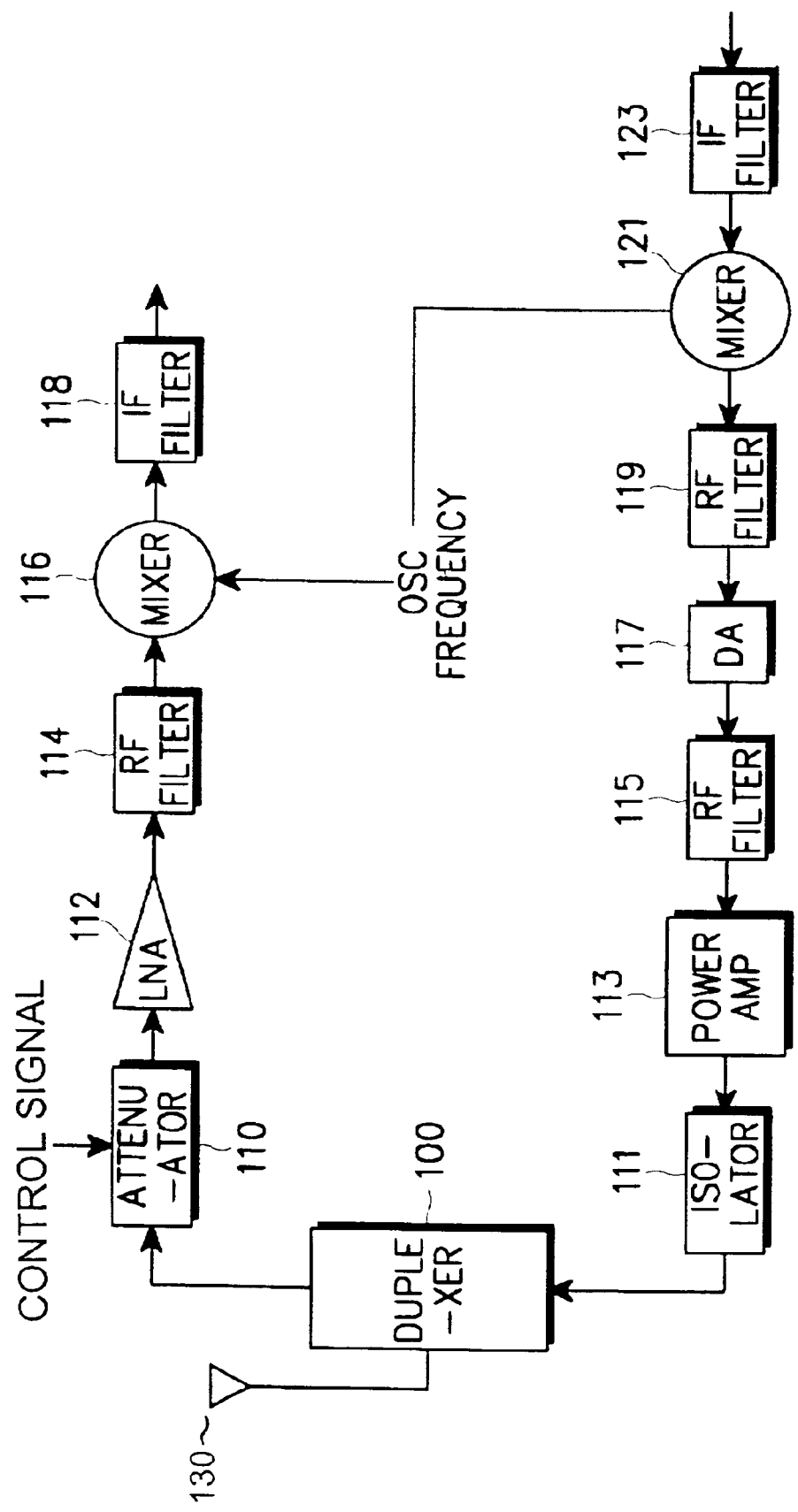
FIG. 1 is a block diagram illustrating a structure of a CDMA mobile terminal with an IMD characteristic improving device according to the prior art.
Figure 2:
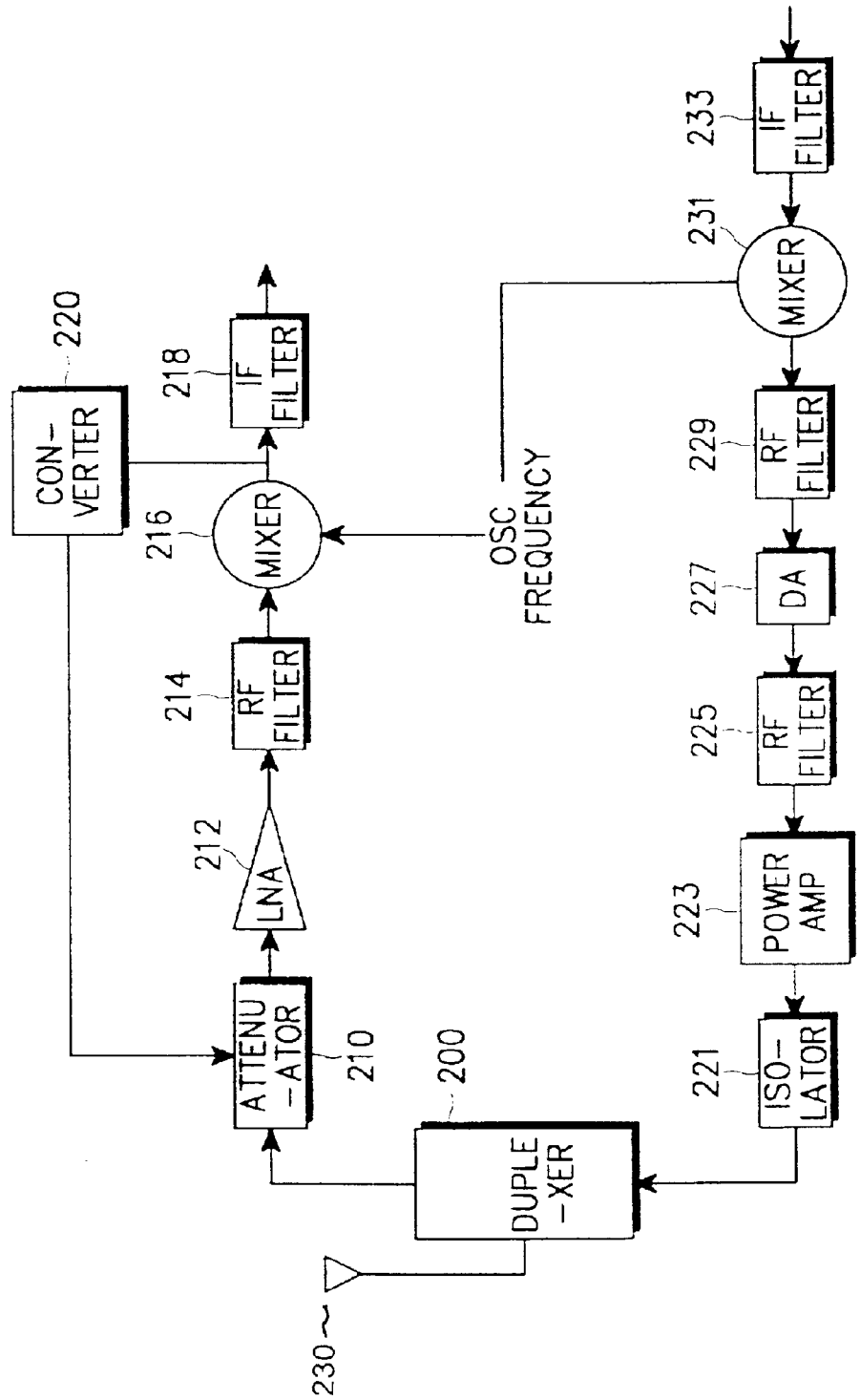
FIG. 2 is a block diagram illustrating a structure of a CDMA mobile terminal with an IMD characteristic improving device according to an embodiment of the present invention.

FIG. 2 shows a structure of a CDMA mobile terminal with an IMD characteristic improving device according to an embodiment of the present invention. Referring to FIG. 2, the IMD characteristic improving device according to an embodiment of the present invention additionally includes a converter 220 for controlling an attenuation of an attenuator 210 interposed between a duplexer 200 and a low-noise amplifier (LNA) 212. The converter 220 is provided to adjust an operating point of the attenuator 210 so as to satisfy the IMD characteristics. The IF filter 233 inputs the modulated IF signals and filters the predetermined transmitting IF frequency signals. The mixer 231 mixes the output of the IF filter 233 with the predetermined local oscillating signals and thus outputs the RF signals. The RF filter 229 filters the mixed signals and detects the RF signals. The drive amplifier 227 amplifies the level of the RF signals so as to obtain the power for driving the power amplifier 223 as stated below. The duplexer 200 switches the connection of the antennas and the transmitting and receiving portion. The RF filter 225 filters the output of the driving amplifier 227, once again. The power amplifier 223 amplifies the filtered RF signals to the predetermined level. The isolator 221 is connected between the output end of the power amplifier 223 and the input end of the duplexer 200 so as to avoid the transmitting distortion of the reflection wave, thereby transmitting the output of the power amplifier 223 to the duplexer 200 without any attenuating. The duplexer 200 switches antenna 230 between a transmitting and receiving mode.

Figure 3:
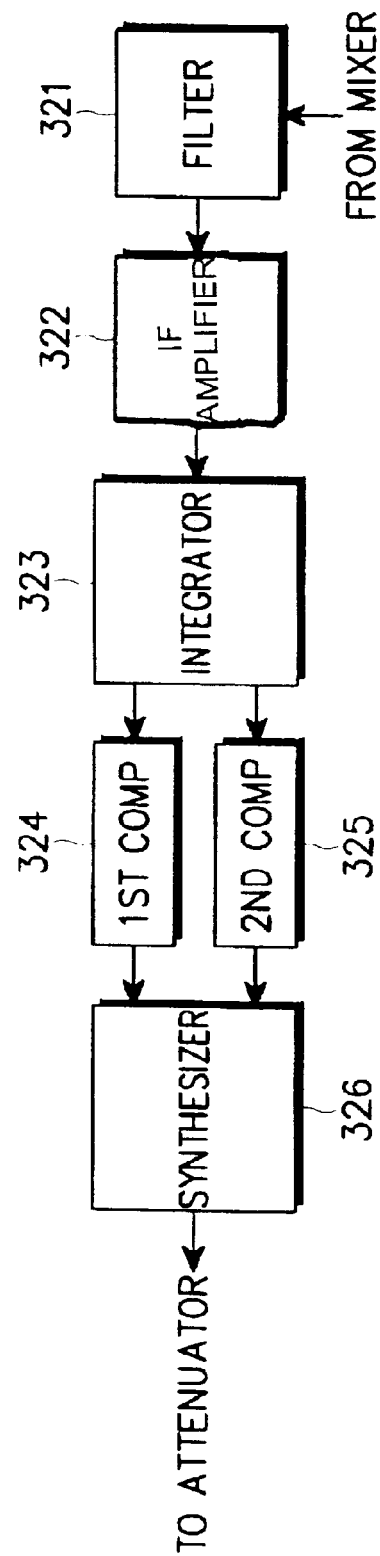
FIG. 3 is a block diagram illustrating a detailed structure of the converter in the IMD characteristic improving device according to an embodiment of the present invention.

FIG. 3 shows the detailed structure of the converter 220 in the IMD characteristic improving device according to an embodiment of the present invention. Referring to FIG. 3, unlike the conventional IMD improving device in which the controller controls an attenuation of the attenuator by software, the IMD improving device according to an embodiment of the present invention includes the converter 220 in order to control an attenuation of the attenuator by hardware. The converter 220 includes a filter 321 for passing signal components except an IF signal component, an IF amplifier 322 for amplifying the signal output from the filter 321, an integrator 323 for converting the signal output from IF amplifier 322 to a DC (Direct Current) signal, first and second comparators 324 and 325 for comparing the DC signal output from the integrator 323 with their predetermined thresholds, respectively, and a synthesizer 326 for synthesizing the signals output from the first and second comparators 324 and 325.

In operation, the filter 321 receives a signal output from a mixer 216 and passes the signal components except an IF signal component. The filter 321 can be implemented by a notch filter, and can also be comprised of a high-pass filter and a low-pass filter. The filter 321 is provided to prevent the IF signal component from being applied to the IF amplifier 322. The IF amplifier 322 amplifies the signal output from the filter 321 to a specific level which is high enough so that the first and second comparators 324 and 325 can compare the level with their thresholds. The integrator 323 converts the signal output from the IF amplifier 322 to a DC signal. The first and second comparators 324 and 325 compare the signal output from the integrator 323 with their thresholds.

In the embodiment of the present invention, the two comparators 324 and 325 are used to satisfy the received-signal processing capability required in the IS-95 IMD characteristic specification as shown in Table 1. The IS-95 IMD characteristic specification specifies the IMD characteristics for the received signal strengths of −90 dBm and −79 dBm. That is, the two comparators 324 and 325 are used to control the attenuator 210 for the received signal strengths of −90 dBm and −79 dBm in order to satisfy the IS-95 IMD characteristic specification. However, according to the specification, the comparator is not required for the IMD characteristic at the received signal strength of −101 dBm.

The thresholds of the comparators 324 and 325 are previously determined according to operating circumstances. For example, an operating point where the comparator operates is previously set by hardware, in order to satisfy the IMD characteristic at −90 dBm. When the converted DC signal for an erroneous input signal is higher than the predetermined threshold, the comparator outputs a HIGH signal to increase the attenuation. The same operation is performed even for the IMD characteristic at −79 dBm.

The synthesizer 326 synthesizes the signals output from the first and second comparators 324 and 325, and provides the attenuator 210 with its output signal as an IMD control signal.

When the received signal strength is −90 dBm, the jammer signal level should be −32 dBm according to the IMD characteristic specification. In this case, only the first comparator 324 generates an output signal, while the second comparator 325 generates no output signal.

However, when the received signal strength is −79 dBm, the jammer signal level should be −21 dBm according to the IMD characteristic specification. In this case, both the first and second comparators 324 and 325 generate their output signals, and the synthesizer 326 synthesizes the signals output from the first and second comparators 324 and 325, and provides the attenuator 210 with its output signal as an IMD control signal.

As described above, the CDMA mobile terminal according to an embodiment of the present invention can solve the reception performance degradation problem due to intermodulation distortion of the received signal. In addition, it is possible to realize real-time control by controlling the attenuator by hardware rather than by software to satisfy the IMD characteristics.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. An apparatus for improving an intermodulation distortion characteristic by controlling a gain of an attenuator in a CDMA (Code Division Multiple Access) mobile terminal, comprising:

a converter for passing input signal components except an IF (Intermediate Frequency) signal component, amplifying the passed input signal to a specific level, converting the amplified signal to a DC (Direct Current) signal, comparing the DC signal with first and second thresholds, and generating a control signal for controlling an operating point of the attenuator by synthesizing the compared result signals;

wherein the converter comprises a filter for passing the input signal components except the IF signal component, the filter including a high-pass filter for passing a high-frequency band signal and a low-pass filter for passing a low-frequency band signal.

2. The apparatus as claimed in claim 1, wherein the converter further comprises:

an IF amplifier for amplifying a signal output from the filter to the specific level;

an integrator for converting a signal output from the IF amplifier to the DC signal;

first and second comparators for comparing a signal output from the integrator with the first and second thresholds, respectively; and a synthesizer for synthesizing signals output from the first and second comparators.

3. The apparatus as claimed in claim 2, wherein the filter is comprised of a notch filter for passing the input signal components except the IF signal component.

4. The apparatus as claimed in claim 2, wherein the IF amplifier amplifies the signal output from the filter to the specific level which is high enough so that the first and second comparators can compare the level with the first and second thresholds, respectively.

5. In a CDMA (Code Division Multiple Access) mobile terminal having an attenuator to control an intermodulation distortion characteristic, and a duplexer to feed a received signal to the attenuator which in turn feeds an attenuated signal to a low noise amplifier, the output of which is filtered in an RF filter and the output voltage level of which is controlled by a mixer, the improvement comprising:

a converter, connected to the output of the mixer, for passing input signal components except an IF (Intermediate Frequency) signal component, amplifying the passed input signal to a specific level, converting the amplified signal to a DC (Direct Current) signal, comparing the DC signal with first and second thresholds, and generating a control signal for controlling an operating point of the attenuator by synthesizing the compared result signals.

6. In a CDMA (Code Division Multiple Access) mobile terminal having an attenuator to control an intermodulation distortion characteristic, and a duplexer to feed a received signal to the attenuator which in turn feeds an attenuated signal to a low noise amplifier, the output of which is filtered in an RF filter and the output voltage level of which is controlled by a mixer, the improvement comprising:

a filter, connected to the output of the mixer, for passing the input signal components except the IF signal component;

an IF amplifier for amplifying a signal output from the filter to the specific level;

an integrator for converting a signal output from the IF amplifier to a DC signal;

first and second comparators for comparing a signal output from the integrator with the first and second thresholds, respectively; and a synthesizer for synthesizing signals output from the first and second comparators.

* * * * *